United States Patent [19]

Nakamura et al.

[11] Patent Number: 4,917,466
[45] Date of Patent: Apr. 17, 1990

[54] METHOD FOR ELECTRICALLY CONNECTING IC CHIPS, A RESINOUS BUMP-FORMING COMPOSITION USED THEREIN AND A LIQUID-CRYSTAL DISPLAY UNIT ELECTRICALLY CONNECTED THEREBY

[75] Inventors: Akio Nakamura; Naoki Kodama; Osami Hayashi, all of Saitama; Hirofumi Saita, Kanagawa, all of Japan

[73] Assignee: Shin-Etsu Polymer Co., Ltd., Kanagawa, Japan

[21] Appl. No.: 227,253

[22] Filed: Aug. 2, 1988

[30] Foreign Application Priority Data

Aug. 13, 1987 [JP] Japan ............................. 62-202225

[51] Int. Cl.$^4$ .............................................. G02F 1/133
[52] U.S. Cl. ................................. 350/336; 350/339 R
[58] Field of Search ................ 350/336, 339 R, 332; 437/180, 183; 439/68, 69, 161, 178, 931; 156/47, 51, 52, 291, 295

[56] References Cited

U.S. PATENT DOCUMENTS

| | | | |
|---|---|---|---|
| 4,362,903 | 12/1982 | Eichelberger et al. | 350/336 |
| 4,413,257 | 12/1983 | Kramer et al. | 350/336 |
| 4,474,432 | 10/1984 | Takamatsu et al. | 350/339 R |
| 4,643,526 | 2/1987 | Watanabe et al. | 350/339 R |

FOREIGN PATENT DOCUMENTS

| | | | |
|---|---|---|---|
| 0069186 | 5/1980 | Japan | 350/336 |
| 0188852 | 12/1982 | Japan | 437/183 |
| 0094330 | 5/1986 | Japan | 437/183 |
| 0279139 | 12/1986 | Japan | 437/183 |

Primary Examiner—Stanley D. Miller
Assistant Examiner—Anita Pellman Gross
Attorney, Agent, or Firm—Wenderoth, Lind & Ponack

[57] ABSTRACT

The invention provides a very efficient and reliable method for electrically connecting the electrodes of an electronic device, e.g., IC chips, and the electrodes of, for example, a glass-made circuit board substrate with good repairability. Thus, the electrodes of the IC chip are each first coated with an electroconductive thermally meltable adhesive resinous composition to form a resinous bump, the IC chip is mounted on the substrate with the adhesive-coated electrodes contacting with the respective electrodes of the substrate, and remelting and then solidifying the resinous bumps so that the electrodes are bonded and electrically connected together. As compared with the conventional methods in which an electroconductive thermosetting resinous composition is used for the bumps on the electrodes, the electrical connection can be obtained with a smaller thermal effect and good replaceability of the IC chip found unacceptable with an acceptable one.

5 Claims, 2 Drawing Sheets

ён4,917,466

METHOD FOR ELECTRICALLY CONNECTING IC CHIPS, A RESINOUS BUMP-FORMING COMPOSITION USED THEREIN AND A LIQUID-CRYSTAL DISPLAY UNIT ELECTRICALLY CONNECTED THEREBY

BACKGROUND OF THE INVENTION

The present invention relates to a method for electrically connecting an electronic device such as IC chips and a circuit board. More particularly, the invention relates to a method for electrically connecting an electronic device to a glass-material circuit board, referred to as a glass substrate hereinafter, with high reliability and outstanding inexpensiveness and still in a high density of mounting per unit area of the circuit board by using electroconductive resinous bumps. The invention further relates to an electroconductive resinous composition used for forming the above mentioned bumps as well as a liquid-crystal display unit in which the electrical connection is obtained by the above mentioned method using the electroconductive resinous composition for forming the above mentioned bumps.

In the technology of plane image display such as dot-matrix liquid-crystal displays, dot-matrix plasma displays and the like in recent years, it is an outstanding trend that these display units are required to have a smaller and smaller thickness and weight while the surface area of the display plane is required to be larger and larger. These requirements are particularly pertinent to modern commercial products such as pocketable television sets, wall-mountable television sets, display units in personal computer systems, terminal display units in various kinds of communication instruments and the like.

One of the key technological points in these display units is in the electrical connection between the circuit board and the IC chips for driving the display unit. Namely, the circuit boards in these display units are mostly made with a glass substrate so that the conventional wire-bonding method is hardly applicable to the direct mounting of IC chips on the circuit board. Accordingly, several indirect methods have been proposed and practiced in many commercial products of the prior art for electrically connecting IC chips to a glass substrate on which the IC chips are mounted including a method in which an IC encapsulated in a flat package (FP) is mounted on a substrate formed of a glass cloth-epoxy resin laminate and the electrical connection with the circuit on the glass substrate is obtained by using a flexible flat connector (FFC) and a method in which the IC chip is mounted on a polyimide resin-based flexible substrate by the TAB method and both of the external terminals of the flexible substrate are connected to the circuit on the glass substrate and the printed circuit board of the control system. These indirect mounting methods, however, are disadvantageous because the IC chip must be mounted on a separate substrate other than the glass substrate so that an additional space therefor is necessitated while the volume of such an additional space must be exponentially increased along with the increase in the number of ICs for driving the display unit which is under the trend toward those having a larger and larger display screen.

Alternatively, several improved methods have been proposed for electrically connecting IC chips and a glass substrate by directly mounting the IC chips thereon. These methods are briefly described with reference to the accompanying drawing.

Firstly, as is illustrated in FIG. 3, an IC chip 21 is provided with bumps 22 of a solder alloy on the input and output electrodes and the IC chip 21 bearing the solder bumps 22 is mounted face-down on a metallized glass substrate 23 and the glass substrate 23 bearing the IC chip 21 is passed through an infrared-heating oven so that the solder bumps 22 are caused to reflow and the IC chip 21 is fixedly positioned by the reflow of the solder bumps 22 with electrical connection to the glass substrate 23. This method is called a flip-chip method.

Secondly, as is illustrated in FIG. 4, an IC chip 31 provided with gold material bumps 32 is mounted face-down on a glass substrate 33 coated beforehand with a pool of an ultraviolet-curable insulating resinous adhesive 34 all over the area for bonding corresponding to the dimension of the IC chip 31 including the input and output electrodes. Thereafter, the insulating adhesive 34 is irradiated with ultraviolet light while the IC chip 31 and the glass substrate 33 are gently pressed together so that the insulating adhesive 34 is cured in situ to fix the IC chip 31 at the position and to establish electrical connection thereof with the glass substrate 33. This method is called a gold bumps-adhesive combination method.

Thirdly, as is illustrated in FIG. 5, an anisotropically electroconductive rubber connector 43 made of an insulating sheet impregnated with anisotropically electroconductive rubber members at the respective proper positions is sandwiched between an IC chip 41 having bumps 42 and a glass substrate 44 and the IC chip 41 and the glass substrate 44 are fixed by pinching with a resilient holder clamp 45 to establish the electrical connection through the anisotropically electroconductive rubber connector 43. This method is called a rubber-connector press-contact method.

Fourthly, as is illustrated in FIG. 6, an IC chip 51 having gold-material electrodes 52 to serve as the input and output terminals is coated on the gold-material electrodes 52 by printing with a thermosetting or heat-curable electroconductive resin 53 and the IC chip 51 is mounted face-down on a glass substrate 55 having terminals thereof contacted with the terminals 52 of the IC chip 51 through the electroconductive resin 53 followed by heating of the assembly so that the heat-curable resin 53 is thermally cured to establish electrical connection between the terminals. This method is disclosed in Japanese Patent Kokai 53-59398. It is usual in this method that the gap between the IC chip 51 and the glass substrate 55 is filled with an epoxy resin 54 in order to enhance the adhesive bonding strength therebetween.

One of the essential requirements in the direct mounting methods of IC chips on a glass substrate is the repairability of the assemblage which means that any IC chip which is found unacceptable by the dynamic test of the assemblage can be easily replaced with another acceptable IC chip without damage to the circuit board and other parts. Namely, acceptability or unacceptability of IC chips can be determined only after the dynamic 100% inspection of the assemblages by using an autoprober to discard unacceptable ones while demounting of a single unacceptable IC chip may destroy the much more expensive glass substrate to cause a great economical loss. When such an unacceptable IC chip can be replaced with another acceptable IC chip without damage to the glass substrate, this economical loss can be greatly decreased so that the above mentioned repairability is a very important requirement.

In the above described gold bumps-adhesive combination method, for example, the adhesive once cured by forming crosslinks with ultraviolet irradiation can not be caused to lose its adhesive bonding strength so that the glass substrate is necessarily damaged when the unacceptable IC chip is forcibly separated therefrom.

Another essential requirement in the direct mounting methods of IC chips on a glass substrate is that the IC chips and the glass substrate are bonded together with high damping characteristics to withstand thermal shocks. It is noted that the linear thermal expansion coefficients of semiconductor silicon, which is the base material of IC chips, and glass, e.g., soda lime glass, which is the material of glass substrates, are $3 \times 10^{-6} °C^{-1}$ and $10 \times 10^{-6} °C^{-1}$, respectively, with a difference of $7 \times 10^{-6} °C^{-1}$. When an IC chip of 10 mm $\times$ 10 mm dimension on a glass substrate is subjected to a heating-cooling cycles between $+70°$ C. and $-20°$ C., for example, the difference in the thermal expansion or thermal contraction between them amounts to about 7 $\mu$m within the bonding plane which causes a considerable stress therein. In the above described flip-chip method in which the IC chip and the glass substrate are directly bonded together by melting the solder bumps, bonding and electrical connection between them are readily destroyed when such a thermal stress is repeated.

Still another essential requirement in the direct mounting methods of IC chips on a glass substrate is that the IC chips and glass substrate should be bonded together at low cost and with high reliability of the electrical connection and that the method be suitable for high-density mounting. Generally speaking, the methods by forming metal bumps are economically not advantageous in respect of the relatively low yield of acceptable products due to the complicated nature of the process. The rubber-connector press-contact method is disadvantageous because the anisotropically electroconductive rubber connector is relatively expensive due to the difficulties in the manufacture thereof and the method is not suitable for high-density mounting due to the bulkiness of the holder clamps. Further, the method using a heat-curable electroconductive adhesive has problems when the method is applied, for example, to liquid-crystal display units. Namely, the electroconductive adhesive must be cured by heating at a high temperature or for a long time so that not only may deterioration may take place in the liquid crystal per se but also several adverse influences are caused on other components of the liquid-crystal display unit such as shrinkage of the polarizing plate and denaturation of the color filter. Thus, each of the above described prior art methods is not satisfactory from a practical standpoint in one or more respects as a method for mounting an IC chip on a glass substrate.

SUMMARY OF THE INVENTION

The present invention accordingly has as an object to provide an improved method for electrically connecting a circuit on a circuit board such as a circuit on a glass substrate and an electronic device such as IC chips mounted thereon in which the above described problems and disadvantages can be solved.

Thus, the method of the present invention for electrically connecting electrodes of an electronic device with respective electrodes of a circuit on a circuit board comprises the steps of:

(a) forming a coating layer or bump of an electroconductive thermoplastic adhesive resinous composition on the electrodes of the electronic device;

(b) putting the electronic device on the circuit board in such a disposition that the electrodes of the electronic device coated with the electroconductive thermoplastic resinous composition are each contacted with the respective electrodes of the circuit board;

(c) pressing the electronic device and the circuit on the circuit board together with a pressure;

(d) heating the coating layer of the electroconductive thermoplastic adhesive resinous composition to cause melting thereof; and (e) cooling the molten electroconductive thermoplastic adhesive resinous composition to solidify the same while maintaining the pressure.

The present invention also provides an electroconductive thermoplastic adhesive resinous composition suitable for use in the above described method which comprises a thermoplastic resin or elastomer as the vehicle polymer and an electroconductive filler optionally together with an organic solvent for the polymer.

DETAILED DESCRIPTION OF THE PREFERRED EMBODIMENTS

Figure 1:
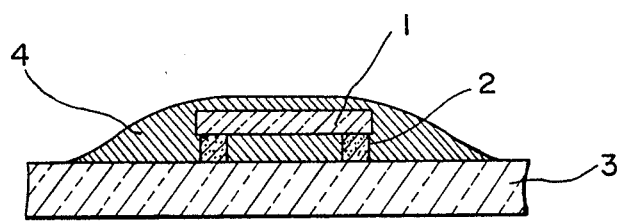
FIG. 1 illustrates a side view of an IC chip and a glass substrate bonded and electrically connected together according to the inventive method.

As is described above, the most characteristic feature of the inventive method consists in the use of an electroconductive thermoplastic or thermally meltable adhesive resinous composition by which the electrodes on the electronic device and the electrodes on the circuit board are bonded and electrically connected. Although the inventive method is seemingly similar to the conventional method in that it uses a heat-curable electroconductive adhesive resin as a material for bumps on the electrodes, various advantages are obtained by the inventive method over such a prior art method. Firstly, the thermally meltable adhesive resin composition can be melted at a much lower temperature than the temperature at which a heat-curable adhesive resin is heated to effect curing. Moreover, different from the method using a heat-curable adhesive resin, heating for a long time is not necessary because the thermally meltable adhesive resinous composition will be melted when the temperature has just exceeded the melting temperature thereof so that the assembling steps can be completed more rapidly than in the prior art method. Secondly, the bonding between an electronic device and a circuit board formed according to the inventive method is more resistant against thermal shocks because thermoplastic resinous compositions usually have much higher resilience than highly crosslinked, thermally cured resin compositions. Thirdly, a thermally meltable resin composition once melted and cooled to solidify can be easily re-melted when the resinous composition is heated again up to a temperature which exceeds the melting temperature thereof so that any electronic device, e.g., IC chips, found unacceptable by a dynamic test of the completed assemblage can be easily replaced with another acceptable device merely by heating the assemblage to melt the adhesive composition and removing the unacceptable device from the circuit board to satisfy the requirement for easy repairability.

The inventive method for electrically connecting an electronic device, e.g., IC chips, and a circuit board is performed according to the principle of thermal melting of electroconductive resinous bumps on the electrodes formed of a thermoplastic or thermally meltable electroconductive adhesive resinous composition. Therefore, the applicability of the inventive method relative to the types of the circuit board is not limited to glass substrates but the method is applicable to any type of circuit board including copper-foiled glass cloth-reinforced laminated epoxy resin substrates, copper-foiled glass cloth-reinforced laminated phenolic resin substrates, copper-foiled glass cloth-reinforced laminated polyimide resin substrates, copper-foiled metal-based substrates, tungstenmetallized alumina-based ceramic substrates, alumina-based ceramic substrates printed with a thick layer of noble metal and the like, i.e. all types of the circuit boards currently in use for directly mounting electronic devices such as IC chips and the like.

The essential ingredients in the electroconductive thermoplastic or thermally meltable resinous adhesive composition are a thermally meltable adhesive resinous polymer as the vehicle and an electroconductive filler. It is of course optional that the composition have admixed there with other known additives such as a tackifying agent and the like according to need. Although the resinous composition can be used as such without dilution with an organic solvent, it is convenient that the resinous composition is admixed with a small volume of an organic solvent so as to be imparted with an appropriate viscosity or consistency most suitable for forming of resinous bumps on the electrodes by the method of extrusion from a precision dispenser or by screen printing.

Various types of thermally meltable adhesive resinous polymers can be used as the vehicle of the composition provided that the resinous polymer can be melted at an appropriate temperature. In particular, it is desirable that the melting temperature of the resinous polymer does not exceed the highest temperature at which no adverse influences are caused on the electronic device built in the assemblage such as a liquid-crystal display unit. Various kinds of known thermoplastic resins and thermoplastic elastomers meet such a requirement. Examples of suitable thermoplastic resins include copolymeric saturated polyester-based resins having a linear molecular structure, butyral resins, vinyl acetate-containing copolymeric resins, resinous cellulose derivatives, poly(methyl methacrylate)-based resins, poly(vinyl ether)-based resins, polyurethane-based resins, polycarbonate-based resins, copolymeric resins of ethylene and vinyl acetate, copolymeric resins of ethylene and ethyl acrylate, copolymeric resins of ethylene, acrylic acid and isobutylene and the like. Examples of suitable thermoplastic elastomers include styrene-butadiene-styrene (S-B-S) type blockwise copolymeric rubbers, styrene-isoprene-styrene (S-I-S) type block-wise copolymeric rubbers, styrene-ethylene-butylene-styrene (S-EB-S) type blockwise copolymeric rubbers, thermoplastic polyester elastomers, thermoplastic polyurethane elastomers, polyethylene-grafted copolymeric butyl rubbers, ionomers, trans-1,4-polyisoprenes, chlorinated polyethylenes and the like.

The above described thermally meltable resinous polymer as the vehicle of the adhesive composition is admixed with a substantial volume of an electroconductive filler in order to be imparted with electroconductivity. Various kinds of known powdery materials having electroconductivity can be used for this purpose without particular limitations. Examples of suitable electroconductive fillers include powders of natural or artificial graphite, carbon blacks such as acetylene black, channel black, furnace black and the like, and powders of metals such as silver, nickel, copper, gold, lead and the like. Since the electroconductive thermally meltable resinous adhesive composition is used usually in the form of an electroconductive ink by dissolving the vehicle polymer in an organic solvent, it is sometimes advantageous that the electroconductive filler is a combination of particles having a flaky configuration and spherical particles of a relatively small diameter in an appropriate proportion. When the electroconductive filler is a carbon black, most of the commercially available carbon black products can be used as such, having an average diameter of the primary particles of from 20 to 50 nm and a particle diameter distribution ranging from 1 to 200 nm. It is preferable, on the other hand, that graphite powders and metal powders are selected from those products having a particle diameter distribution in the range from 0.3 to 30 $\mu$m or, more preferably, in the range from 1 to 10 $\mu$m. When the particle diameter of these electroconductive fillers is too large, the rheological property of the electroconductive ink compounded with the filler in a solvent of the vehicle polymer is not suitable for screen printing in addition to the disadvantage of the statistic decrease in the number of the particles forming an effective contacting area with the surface of the electrode resulting in decreased reliability of the electrical connection. When the particle size thereof is too small, on the other hand, the electroconductive bumps may have an increased volume resistivity as a trend due to the statistical decrease in the particle-to-particle contacting area. The amount of the electroconductive filler compounded with the vehicle polymer should be sufficient to impart the electroconductive bumps with a low volume resistivity of, for example from $1 \times 10^{-5}$ ohm·cm to 10 ohm·cm. The actual amount of the electroconductive filler naturally depends on several factors but it is usually in the range from 20 to 60% by volume based on the volume of the vehicle polymer.

It is important that the electroconductive thermally meltable adhesive resinous composition for the electroconductive bumps on the electrodes of the electronic device should exhibit good adhesive bonding to the electrode of the circuit board which may be an aluminum-made electrode, ITO (indium-tin oxide) electrode, chromium-plated electrode, gold-plated electrode, nickel-plated electrode and the like. In this regard, it is sometimes advantageous that the adhesive resinous composition is admixed with a tackifying agent such as rosin and derivatives thereof, modified or unmodified terpene resins, petroleum resins, coumarone-indene resins, phenolic resins, alkyd resins and the like.

It is further optional that the electroconductive thermally meltable adhesive resinous composition is admixed with a waxy material with the object of controlling the melting temperature of the vehicle polymer in a desirably decreased temperature range. Examples of suitable waxy materials, desirably having a melting point in the range from 40° to 80° C., include natural origin such as carnauba wax, rice wax, Japan wax, beeswax, montan wax, paraffin wax, microcrystalline wax and the like and synthetic and semi-synthetic waxes such as polyethylene wax, modified montan wax, modified paraffin wax, modified microcrystalline wax, Fischer-Tropsch wax and the like. It is of course optional that the electroconductive thermally meltable adhesive resinous composition is further admixed with various kinds of known additives such as aging retarders, antioxidants, stabilizers and the like each in a limited amount according to need.

The electroconductive resinous bumps on the electrodes of an electronic device are formed by using the above described electroconductive thermally meltable adhesive resinous composition which is preferably diluted with an organic solvent to be imparted with an adequate consistency. A typical procedure for the preparation of such a liquid composition is that the vehicle resinous polymer is first admixed with additives such as tackifying agents, waxes and the like and dissolved in an organic solvent and the thus obtained solution is then admixed with the electroconductive filler. Resinous bumps on the electrodes can be formed using the liquid composition conveniently by the method of screen printing using a patterned screen put on to the electrodes of the electronic device, e.g., IC chips and IC wafers, by correct positioning followed by evaporation of the solvent to form dry solid bumps. It is optional that an IC wafer is first provided with the electroconductive resinous bumps on all of the electrodes and then divided into respective IC chips. When the electrodes are made of aluminum, it is preferable that the surface of the aluminum electrode is provided with a thin plating layer of an oxidation-resistant metal such as nickel, silver, gold, palladium and the like so as to ensure good electrical connection. The circumferential form of the resinous bumps can be rectangular in conformity with the configuration of the electrode or circular, although this is not particularly limited. The height of the resinous bumps is an important factor and preferably in the range from 5 to 50 μm. When the height of the resinous bump is too small, no sufficient cushoning effect can be obtained against thermal shocks between the electrodes of the electronic device and the circuit board. When the height of the resinous bump is too large or the amount of the resinous composition forming a bump is too large, a problem may be caused that the resinous composition, when it is melted, causes lateral running out of the composition on the electrode surface with eventual inadvertent electrical connection between laterally spaced electrodes.

The electroconductive resinous bumps should have a volume resistivity in the range from $1 \times 10^{-5}$ ohm·cm to 10 ohm·cm as is mentioned above depending on the particular type of the application. For example, it is desirable that the volume resistivity thereof is $1 \times 10^{-3}$ ohm·cm or smaller in order to ensure an electrode-to-electrode contact resistance not exceeding 0.1 ohm in certain ICs, such as bipolar ICs, P-MOS ICs, N-MOS ICs and the like, for driving display units such as plasma displays, fluorescent character display tubes, EL displays, LED displays and the like by passing a relatively large electric current in the order of 10 to 100 mA.

The electronic device, e.g., IC chips, provided with the electroconductive resinous bumps on the electrodes is directly mounted on a circuit board, e.g., glass substrate, in such a manner that the electrodes of the IC chip provided with the resinous bumps are in contact with the respective electrodes of the circuit on the glass substrate. Thereafter, the IC chip is gently pressed down by using a heating tool on the back surface to press the chip against the glass substrate which is also under heating so that the electroconductive adhesive resinous composition of the bumps is melted between the electrodes followed by spontaneous cooling to solidify the molten resinous composition. By this means, the once melted and then solidified resinous composition is adhesively bonded to the surface of the electrodes of both of the IC chip and the glass substrate so that the IC chip and the circuit on the glass substrate are electrically connected through the electroconductive adhesive resinous composition along with mechanical bonding by adhesion.

The assemblage of the IC chip and the glass substrate thus bonded and connected together is then subjected to a dynamic test of the performance before it is put to use after confirmation of the acceptability of the IC chip. It is optional that, as is illustrated in FIG. 1, the IC chip 1 is encapsulated with a chip-coating resin 4 so that the adhesion between the IC chip 1 and the glass substrate 3 is further strengthened and the IC chip 1 and the electrical connection through the electroconductive resinous composition 2 can be protected against adverse effects of vibration and thermal shock as well as atmospheric moisture and contaminating gases. In this regard, it is preferable that the chip-coating resin 4 has a thermal expansion coefficient as close as possible to that of the material of the glass substrate 3, i.e. soda lime glass, or $20 \times 10^{-6} °C^{-1}$ or smaller by loading a vehicle resin such as an epoxy resin with a substantial amount of a powder of quartz, fused silica, glass or the like.

It should be noted that the chip-coating resin 4 most suitable for the purpose has properties to satisfy the relationship expressed by the inequalities $$A+u>W>P+w$$

and $$B+v>W>P+w,$$

in which W is the contracting stress in the chip-coating resin 4 by which the IC chip 1 and the glass substrate 3 are attracted to each other, P is the thermal stress by which they are pulled apart, A is the adhesive bonding strength between the IC chip 1 and the chip-coating resin 4, B is the adhesive bonding strength between the electrode on the glass substrate 3 and the chip-coating resin 4, u is the adhesive bonding strength between the electroconductive resinous bump and the IC chip 1, v is the adhesive bonding strength between the electroconductive resinous bump and the electrode on the glass substrate 3 and w is the thermal stress in the electroconductive resinous bump under expansion. Usually, u and v are each larger than w.

The method of the present invention for electrically connecting an IC chip and a glass substrate is performed in the above described manner, by which the electrode terminals of the IC chip and the glass substrate are respectively connected together electrically with high reliability through the adhesive layer of the electroconductive resinous composition formed by melting and solidifying the resinous bumps. The electrical connection thus formed has good repairability by merely remelting of the electroconductive resinous layer, which is mainly composed of a thermally meltable resinous polymer, between the electrodes so that any IC chip found unacceptable by the dynamic test can easily be replaced with an acceptable one. Moreover, the resinous adhesive layer, mainly composed of a thermoplastic resin or thermoplastic elastomer as the vehicle, has an elastic modulus as small as about one tenth of that of solder alloys so that an excellent damping effect can be obtained against thermal shocks. Therefore, the present invention provides a very reliable method for direct electrical connection of the electrodes of an IC chip and a circuit on a glass substrate with high stability.

Figure 2:
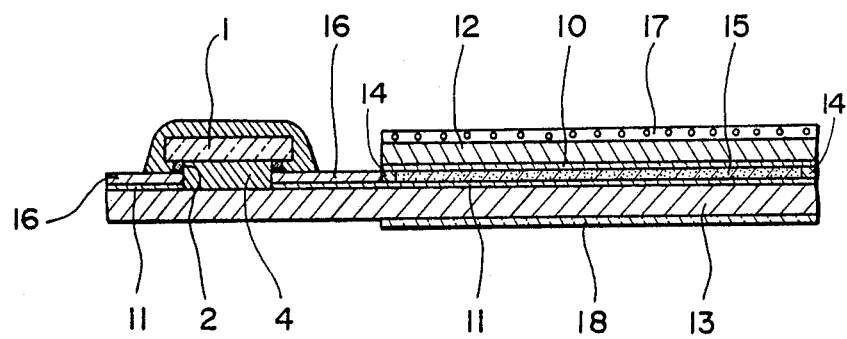
FIG. 2 is a side view of a liquid-crystal display unit assembled according to the inventive method.
Figure 3:
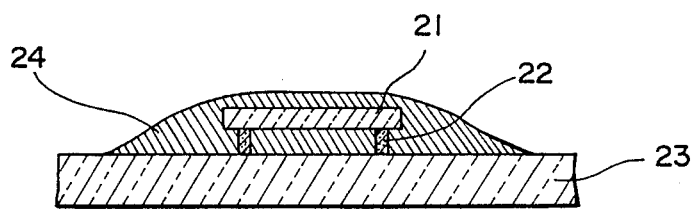
FIGS. 3 to 6 are each a side view of an IC chip and a glass substrate bonded and electrically connected according to a prior art method.
Figure 4:
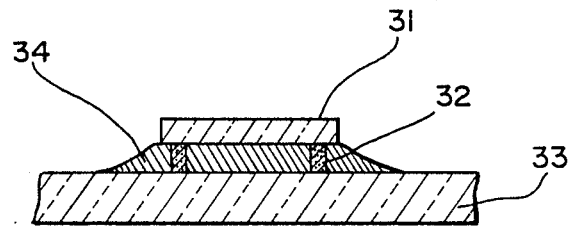
Figure 5:
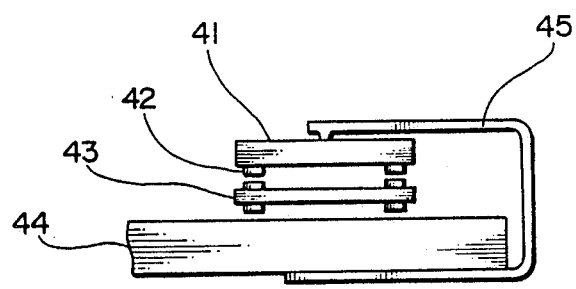

The above described method for the electrical connection and the bump-forming resinous composition is applicable to the assemblage of liquid-crystal display units. FIG. 2 illustrates a schematic cross sectional view of a liquid-crystal display unit constructed according to the invention. The upper substrate 12 and lower substrate 13 each provided with an ITO (indium-tin oxide) electrode 10 or 11, respectively, are sealed with a sealing agent 14 with the electrodes 10 and 11 facing each other and the gap therebetween is filled with a liquid crystal 15. The lower substrate 13 is extended leftwardly in the figure beyond the left end of the upper substrate 12 and the electrode 11 on this extended portion of the lower substrate 13 is provided with an overlay film 16 of a metal such as gold, silver and the like. Each of the substrates 12 and 13 is provided with a polarizing plate 17 or 18 on the opposite surface from the electrode 10 or 11. An IC chip 1 is mounted on the extended portion of the lower substrate 13 and electrically connected to the terminal electrodes of the substrate 13 by using electroconductive resinous bumps 2 similar to those illustrated in FIG. 1.

Figure 6:
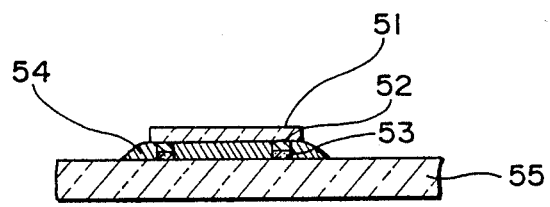

The mounting of the IC chip 1 on the substrate 13 can be performed in the manner illustrated with reference to FIG. 2 at a lower temperature and within a shorter length of time than in the manner illustrated with reference to FIG. 6 in which the electrical connection between the IC chip 51 and the glass substrate 55 can be obtained only after thermal curing of the electroconductive bumps 53 mainly composed of a thermosetting resin because the electrical connection in this case can be established merely by melting and re-solidifying the electroconductive bumps 2 mainly composed of a thermally meltable resinous polymer. Consequently, the polarizing plates 17 and 18 are safe from the drawbacks of shrinkage by undue heating which might lead to a decrease in the quality of the display. Any IC chip found unacceptable by the dynamic test after assemblage can easily be detached from the substrate by merely re-heating and replaced with another acceptable one so that the overall productivity of the manufacturing process of liquid-crystal display units can be greatly improved. It is an additional advantage that the bumps on the electrodes are formed of a solid electroconductive resinous composition even before the assemblage work so that the IC chips provided with the bumps on the electrodes can be handled without causing troubles as compared with the assemblage illustrated in FIG. 6 in which the electroconductive bumps are formed of a thermosetting resin composition which sometimes has stickiness before curing.

In the following, the present invention is described in more detail by way of an example, in which the term of "parts" always refers to "parts by weight".

EXAMPLE

A solution-type electroconductive adhesive resinous composition was prepared by admixing a vehicle resin solution obtained by dissolving 60 parts of a styrene-ethylene-butylene-styrene type block-copolymeric resin (Crayton G1657, a product of Shell Chemical Co.), 40 parts of a terpene-phenolic resin (YS Polystar T130, a product of Yasuhara Yushi Co.) and 1 part of an aging retarder (Antage DAN, a product of Kawaguchi Chemical Co.) in 200 parts of toluene with a 80:20 by weight blend of a high-purity flaky silver powder having particle dimensions of $2 \times 10$ μm (No. 3, B-1, a product of Moritex Co.) and a high-purity silver powder having a particle diameter of 3 μm (Type G, a product of the same company, supra) in such an amount that the volume ratio of the silver powders and the vehicle resins was 40:60.

Separately, thin silver coating layers were formed on the aluminum-made electrodes of an about 6 mm square IC chip for conduction test (T-18A MECHA, a product of Toshiba Co.) having a thickness of 0.45 mm. The silver-coated electrodes each 100 μm by 100 μm wide were coated with the above prepared liquid electroconductive resinous composition by the method of screen printing using a printing screen having a pattern to conform with the arrangement of the electrodes followed by evaporation of the solvent by heating at 100° C. for 30 minutes. The thus formed electroconductive resinous bumps each had a diameter of about 100 μm and a height of about 20 μm.

In the next step, a glass substrate having a thickness of 1.1 mm for testing was provided with a circuit formed by gold-plating and coated with chromium by vapor-phase deposition and the above prepared IC chip having the bumps of the electroconductive resin was mounted face-down with correct positioning on the chip-on pattern of the glass substrate. The glass substrate was heated at 80° C. using a COG tester manufactured for this specific purpose and the IC chip was pressed down against the glass substrate for about 10 seconds under a pressure of 0.5 kg/cm$^2$ with a heating tool having a tip at a temperature of 150° C. on the back surface of the IC chip. When the resinous bumps under visual inspection had become molten, the heating tool was removed and, heating of the glass substrate was interrupted to effect spontaneous cooling of the IC chip and solidification of the molten resinous bumps. The contact resistance through the electroconductive resinous bumps was determined by a 4-probe resistance testing method with a measuring current of 10 mA to give a result of 20 m ohm per pin. The electrical insulating resistance between laterally positioned electrodes was at least 10$^8$ ohm.

The above prepared assemblage of the glass substrate and the IC chip was again heated in heating conditions substantially identical with those for bonding them to cause re-melting of the electroconductive resinous adhesive so that the IC chip could easily be picked up from the glass substrate by using tweezers to show that any IC chip found unacceptable can be easily replaced with another IC chip absolutely without damage to the glass substrate. Further, the assemblage of the glass substrate and the IC chip was subjected to a test of chilling-heating cycles in which a cycle was composed of chilling at −20° C. for 30 minutes, heating at 70° C. for 30 minutes and keeping at 25° C. for 5 minutes, and no noticeable changes after 500 cycles were found in any of the pins.

The IC chip bonded to the glass substrate was encapsulated with an epoxy-based chip-coating resin having a linear thermal expansion coefficient of $2.7\times 10^{-5}$ °C$^{-1}$ by dropping the liquid resin to form a dome-like covering layer having a diameter of 10 mm and a height of 1 mm followed by curing. The thus resin-encapsulated IC chip did not fall off the glass substrate even when the glass substrate was shaken violently without noticeable changes in the contact resistance through the electroconductive resinous bumps.

Substantially the same experimental results were obtained when bumps of the electroconductive resinous composition were formed on the electrodes of an IC wafer followed by scribing and dividing of the IC wafer into several IC chips.

What is claimed is:

1. A method for electrically connecting electrodes of an electronic device with respective electrodes of a circuit board which comprises the steps of:
    (a) forming a coating layer of an electroconductive thermoplastic adhesive resinous composition on the electrodes of the electronic device;
    (b) putting the electronic device on the circuit board in such a position that the electrodes of the electronic device coated with the electroconductive thermoplastic resinous composition are each contacted with the respective electrodes of the circuit board;
    (c) pressing the electronic device and the circuit board together with a pressure;
    (d) heating the coating layer of the electroconductive thermoplastic adhesive resinous composition to cause melting thereof; and
    (e) cooling the molten electroconductive thermoplastic adhesive resinous composition to effect solidification of the same while maintaining the pressure.

2. The method as claimed in claim 1 wherein the coating layer of an electroconductive thermoplastic adhesive resinous composition is formed on the electrodes of the electronic device by using the composition diluted with an organic solvent followed by evaporation of the organic solvent to dryness.

3. The method as claimed in claim 1 wherein the coating layer of an electroconductive thermoplastic adhesive resinous composition formed on the electrodes of the electronic device has a thickness in the range from 5 to 50 μm.

4. The method as claimed in claim 1 wherein the coating layer of an electroconductive thermoplastic adhesive resinous composition formed on the electrodes of the electronic device has a volume resistivity in the range from $1\times 10^{-5}$ ohm·cm to 10 ohm·cm.

5. In a liquid-crystal display unit comprising two circuit board substrates disposed in parallel with a space therebetween filled with a liquid crystal, at least one of the substrates being electrically connected to an IC chip for driving the liquid-crystal display, an improvement that the electrodes of the substrate and the respective electrodes of the IC chip are electrically connected by the steps of:
    (a) forming a coating layer of an electroconductive thermoplastic adhesive resinous composition on the electrodes of the IC chip;
    (b) putting the IC chip on the substrate in such a position that the electrodes of the IC chip coated with the electroconductive thermoplastic resinous composition are each contacted with the respective electrodes of the substrate;
    (c) pressing the IC chip and the substrate together with a pressure;
    (d) heating the coating layer of the electroconductive thermoplastic adhesive resinous composition to cause melting thereof; and
    (e) cooling the molten electroconductive thermoplastic adhesive resinous composition to effect solidification of the same while maintaining the pressure.

* * * * *

UNITED STATES PATENT AND TRADEMARK OFFICE
CERTIFICATE OF CORRECTION

PATENT NO. : 4,917,466

DATED : April 17, 1990

INVENTOR(S) : Akio NAKAMURA et al.

It is certified that error appears in the above-identified patent and that said Letters Patent is hereby corrected as shown below:

Title page, item [73], for "Shin-Etsu Polymer Co., Ltd. of Kanagawa, Japan" read --Shin-Etsu Polymer Co., Ltd. of Tokyo, Japan--; and --Kabushiki Kaisha Toshiba of Kanagawa-ken, Japan--.

Signed and Sealed this

Thirteenth Day of August, 1991

Attest:

HARRY F. MANBECK, JR.

Attesting Officer

Commissioner of Patents and Trademarks